US012184958B2

(12) United States Patent
Moncino et al.

(10) Patent No.: US 12,184,958 B2
(45) Date of Patent: Dec. 31, 2024

(54) INTEGRATED CAMERA WITH EMBEDDED HEATER SYSTEMS AND METHODS

(71) Applicant: Teledyne FLIR Commercial Systems, Inc., Goleta, CA (US)

(72) Inventors: Kai Moncino, Santa Barbara, CA (US); Marcel Tremblay, Goleta, CA (US)

(73) Assignee: Teledyne FLIR Commercial Systems, Inc., Goleta, CA (US)

( * ) Notice: Subject to any disclaimer, the term of this patent is extended or adjusted under 35 U.S.C. 154(b) by 222 days.

(21) Appl. No.: 17/361,205

(22) Filed: Jun. 28, 2021

(65) Prior Publication Data

US 2021/0329148 A1  Oct. 21, 2021

Related U.S. Application Data

(63) Continuation of application No. PCT/US2019/061307, filed on Nov. 13, 2019.

(60) Provisional application No. 62/786,289, filed on Dec. 28, 2018.

(51) Int. Cl.

| *H04N 23/51* | (2023.01) |
| *G02B 7/02*  | (2021.01) |
| *H04N 23/11* | (2023.01) |
| *H04N 23/52* | (2023.01) |
| *H04N 23/55* | (2023.01) |

(52) U.S. Cl.
CPC ............. *H04N 23/51* (2023.01); *G02B 7/028* (2013.01); *H04N 23/52* (2023.01); *H04N 23/55* (2023.01); *H04N 23/11* (2023.01)

(58) Field of Classification Search
CPC ........ G02B 7/028; H04N 23/11; H04N 23/51; H04N 23/52; H04N 23/55
See application file for complete search history.

(56) References Cited

U.S. PATENT DOCUMENTS

| 3,681,637 | A | 8/1972 | Simpson |
| 6,748,646 | B2 | 6/2004 | Arx et al. |
| 10,609,262 | B2 * | 3/2020 | Kim ................. G02B 7/028 |
| 11,546,492 | B2 * | 1/2023 | Hendricks .......... H04N 23/52 |
| 2007/0109441 | A1 | 5/2007 | Cheng |
| 2011/0266375 | A1 | 11/2011 | Ono et al. |
| 2013/0070102 | A1 * | 3/2013 | Gustafson ........... H04N 5/33 348/E5.09 |
| 2014/0168507 | A1 | 6/2014 | Renaud |
| 2015/0116590 | A1 * | 4/2015 | Huang ............... G03B 17/55 348/373 |
| 2016/0344977 | A1 * | 11/2016 | Murao ............... B60R 11/04 |
| 2017/0297504 | A1 * | 10/2017 | Leonelli, Jr. ........ B60R 11/04 |
| 2018/0222402 | A1 * | 8/2018 | Bingle ............... H04N 23/54 |

FOREIGN PATENT DOCUMENTS

| CN | 205067942 U | 3/2016 |
| CN | 205647718 U | 10/2016 |
| CN | 206807583 U | 12/2017 |

(Continued)

*Primary Examiner* — Amy R Hsu

(74) *Attorney, Agent, or Firm* — Haynes and Boone, LLP

(57) ABSTRACT

Various embodiments of the present disclosure may include an imaging system that includes a heating element for de-icing. The heating element may be positioned to heat a lens and the front of the housing of the imaging system. Additionally, imaging system or a portion thereof may be manufactured using a continuous molding process.

20 Claims, 9 Drawing Sheets

(56) References Cited

FOREIGN PATENT DOCUMENTS

| | | |
|---|---|---|
| DE | 4436087 A1 | 4/1996 |
| DE | 4436087 C2 | 4/1996 |
| EP | 3079348 | 10/2016 |
| EP | 3079348 A1 | 10/2016 |
| JP | 4808949 B2 | 4/2006 |

\* cited by examiner

INTEGRATED CAMERA WITH EMBEDDED HEATER SYSTEMS AND METHODS

CROSS-REFERENCE TO RELATED APPLICATIONS

This application is a continuation of International Patent Application No. PCT/US2019/061307 filed Nov. 13, 2019 and entitled "INTEGRATED CAMERA WITH EMBEDDED HEATER SYSTEMS AND METHODS," which are all hereby incorporated by reference in its entirety.

International Patent Application No. PCT/US2019/061307 claims the benefit of and priority to U.S. Provisional Patent Application No. 62/786,289 filed Dec. 28, 2018 and entitled "INTEGRATED CAMERA WITH EMBEDDED HEATER SYSTEMS AND METHODS" which is hereby incorporated by reference in its entirety.

TECHNICAL FIELD

One or more embodiments of the invention relate generally to imaging devices and more particularly to imaging devices configured for cold weather.

BACKGROUND

In cold environments, ice can build-up on the housing and the lenses of an imaging device. As components of the imaging device, such as the lenses, are exposed to the cold and drop in temperature, moisture within the air may condense on such components and freeze to form ice. Ice on the imaging device can impair sensing by the imaging devices, especially if the imaging device is an infrared imaging device. In certain situations, such ice can build up when cameras are not operated. When the camera is operated, heating may be required to melt the built-up ice before useful images are obtained by the camera. However, typical camera heating systems may fail to melt the ice sufficiently or effectively, such as in a sufficiently short amount of time.

SUMMARY

Systems and methods are disclosed herein for providing an imaging system with a de-icing assembly. In certain embodiments, an apparatus may be provided. The apparatus may include a housing including a front region, an optical element disposed proximate to the front region, and a heating element thermally conductively coupled to the front region and the heating element, disposed proximate to the optical element and the front region, and configured to conductively heat the optical element and the front region.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Techniques and mechanisms are provided in accordance with one or more embodiments to de-ice or prevent icing on an imaging system. The camera may include a housing, a lens, a heating element and an imaging device. The lens may be coupled to the housing. The heating element may be positioned to minimize the distances from the heating element to the lens and to the front of the housing. Such a configuration may allow for rapid heating of portions of the housing and the lens to melt ice accumulated on the camera.

In certain situations, heating only the lens of a camera can result in the formation of an air pocket in front of the lens as ice that is attached to the housing is not melted. Such an air pocket can significantly increase the amount of time needed to melt enough ice to clear the field of vision of the camera due to the insulation properties of air. By contrast, the currently disclosed camera may heat both a front portion of the housing and the lens, to ensure that all ice on the front of the camera is melted and prevent formation of the air pocket. Ideally, heat from a heater is transferred to the lens and the front of the housing to melt ice with no heat lost to other portions of the housing. The configuration of the current camera approximates this ideal situation as closely as is practical.

Additionally, embodiments of the camera disclosed may be manufactured by forming multiple components within a single continuous molding process. Such a continuous molding process may allow for multiple components of the camera to be formed in a single tool without removal of the camera from the tool in between forming steps. Such a process allows for cameras with better sealing, lower cost, and quicker production time.

Figure 1:
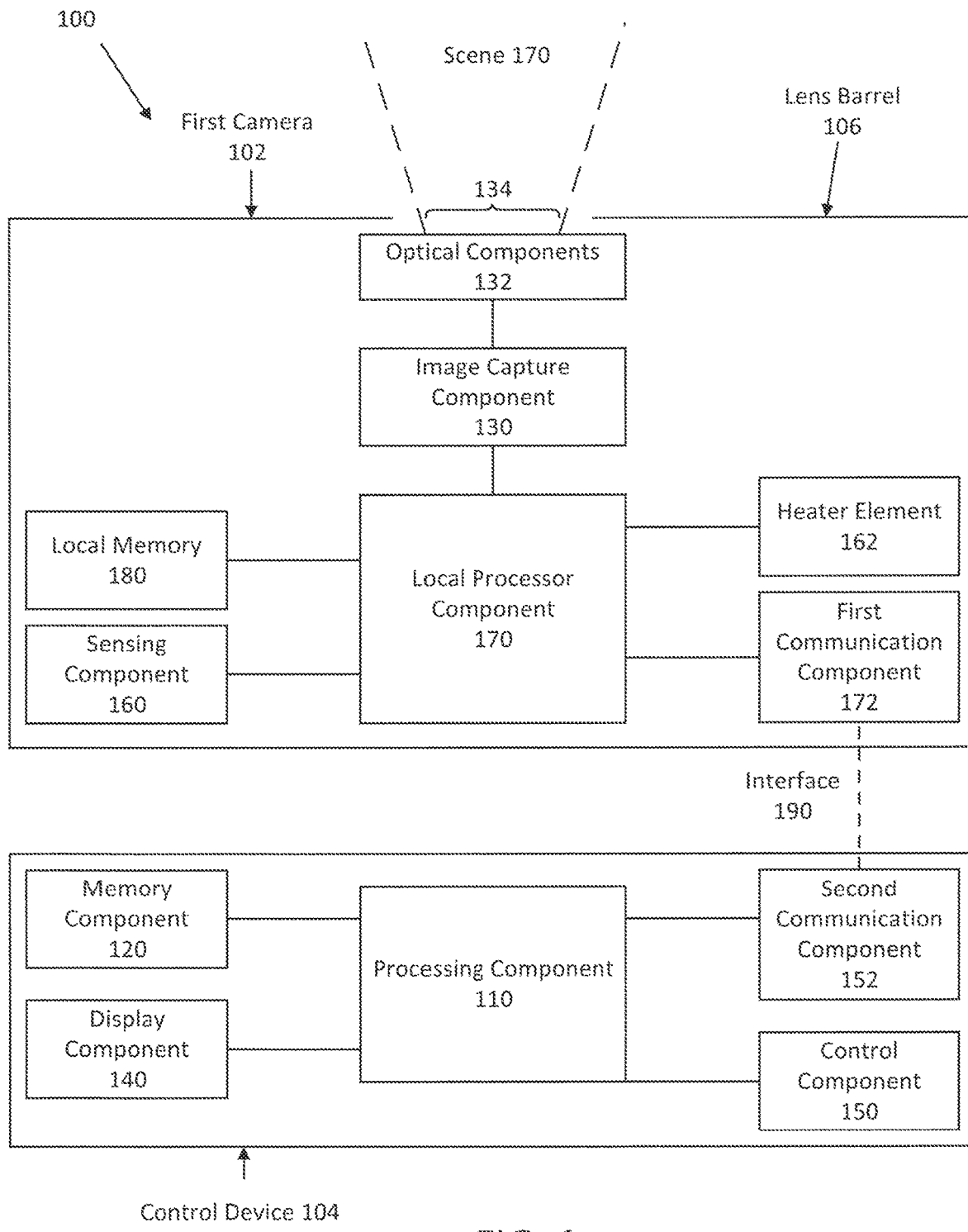
FIG. 1 illustrates a block diagram of an imaging system in accordance with an embodiment of the disclosure.

FIG. 1 illustrates a block diagram of an imaging system in accordance with an embodiment of the disclosure. Imaging system 100 in FIG. 1 may be used to capture and process image frames in accordance with various techniques described herein.

Imaging system 100 includes a first camera 102 and a control device 104 in communication with the first camera 102. In certain embodiments, components of the imaging system 100, such as the first camera 102 and the control device 104, may be distributed over one or multiple devices. Some such embodiments may distribute one, some, or all of the components of imaging system 100 over the cloud. Thus, in those embodiments, image processing may be performed over the cloud, using one or multiple cloud devices, by sending image data over the cloud. Once the image has been processed, the image may be displayed or stored via an internet service (such as on YouTube®, Dropbox®, Google Drive®, etc.) or sent back to a user device and displayed or stored on the user device. In various embodiments, either the first camera 102 and/or the control device 104 may be a camera, a camera suite, a sensor suite, a smartphone, a computer, a server, a tablet, or another type of electronic device.

In certain embodiments, the first camera 102 and the control device 104 may be coupled together. That is, the first camera 102 may be a camera attachment that may be fitted or communicatively connected (e.g., via Bluetooth) to the control device 104. The control device 104 may run an application that performs at least a portion of an image processing procedure. In such an embodiment, the control device 104 may be a smartphone, a tablet, a computer, or another type of electronic device that may receive the camera attachment. In certain embodiments, the camera attachment may be fitted via connectors such as USB or Lightning Cable connectors. Other embodiments may connect the first camera 102 and the control device 104 through a network connection, such as via Bluetooth, the internet, Near Field Communications ("NFC"), Local Area Network ("LAN"), or other network connections.

In one embodiment, the first camera 102 includes a logic device 170, a local memory 180, an image capture component 130, optical components 132, a first communication component 172, a sensing component 160, and a heating element 162. The control device 104 may include a processing component 110, a memory component 120, a display component 140, a second communication component 152, and a control component 150.

In various embodiments, the first camera 102 may be implemented as an imaging device, such as a camera, to capture image frames of, for example, a scene 170 (e.g., a field of view). The first camera 102 may represent any type of camera which, for example, detects electromagnetic radiation (e.g., irradiance) and provides representative data (e.g., one or more still image frames or video image frames). For example, the first camera 102 may represent a camera that is directed to detect one or more ranges (e.g., wavebands) of electromagnetic radiation and provide associated image data. Imaging system 100 may include a portable device and may be implemented, for example, as a handheld device and/or coupled, in other examples, to various types of vehicles (e.g., a land-based vehicle, a watercraft, an aircraft, a spacecraft, or other vehicle) or to various types of fixed locations (e.g., a home security mount, a campsite or outdoors mount, or other location) via one or more types of mounts. In still another example, the first camera 102 may be integrated as part of a non-mobile installation to provide image frames to be stored and/or displayed.

The logic device 170 and/or the processing component 110 may include, for example, a microprocessor, a single-core processor, a multi-core processor, a microcontroller, a logic device (e.g., a programmable logic device configured to perform processing operations), a digital signal processing (DSP) device, one or more memories for storing executable instructions (e.g., software, firmware, or other instructions), and/or or any other appropriate combination of processing device and/or memory to execute instructions to perform any of the various operations described herein. The logic device 170 may be adapted to interface and communicate with components 130, 160, 162, 172, and 180 to perform method and processing steps as described herein. The processing component 110 may be adapted to interface and communicate with components 120, 140, 150, and 152.

Additionally, the logic device 170 may be adapted to receive image signals from image capture component 130, process image signals (e.g., to provide processed image data), store image signals or image data in local memory 180, and/or retrieve stored image signals from local memory 180. Certain embodiments of the first camera 102 may include a plurality of image capture components. Such embodiments may capture multiple scenes and the logic device 170 and/or the processing component 110 may then create a composite image out of the multiple scenes captured by the plurality of image capture components. The logic device 170 may also communicate data, via the first communication component 172, to the control device 104. The first communication component 172 may communicate with the control device 104 via an interface 190 established between the first communication component 172 and the second communication component 152 of the control device 104. In various embodiments, the interface 190 may be a Bluetooth link, a WiFi link, a NFC link, a wired connection, or another type of link between the first camera 102 and the control device 104.

The local memory 180 and/or the memory component 120 includes, in one embodiment, one or more memory devices (e.g., one or more memories) to store data and information. The one or more memory devices may include various types of memory including volatile and non-volatile memory devices, such as RAM (Random Access Memory), ROM (Read-Only Memory), EEPROM (Electrically-Erasable Read-Only Memory), flash memory, or other types of memory. In one embodiment, processing component 110 and/or the logic device 170 is adapted to execute software stored in the memory component 120 and/or the local memory 180, respectively, to perform various methods, processes, and modes of operations in manner as described herein.

Image capture component 130 includes, in one embodiment, one or more sensors (e.g., any type of visible light, infrared, or other type of detector, including a detector implemented as part of a focal plane array or as a single detector) for capturing image signals representative of an image, of scene 170. In one embodiment, the sensors of image capture component 130 (e.g., an infrared sensor) provide for representing (e.g., converting) a captured thermal or radiometric image signal of scene 170 as digital data (e.g., via an analog-to-digital converter included as part of the sensor or separate from the sensor as part of imaging system 100). The image capture component 130 may capture high dynamic range radiometric thermal images or videos. The image capture component 130 may be, for example, a bolometer based imaging apparatus (e.g., the image capture component 130 may be an array of sensors).

Optical components 132 may include one or more lenses configured to receive electromagnetic radiation through an aperture 134 in lens barrel 106 and pass the electromagnetic radiation to image capture component 130. In certain embodiments, lens barrel 106 may be a portion of a housing that encloses one or more components of imaging system 100.

Optical components 132 may also include one or more filters (e.g., warm filters, bandpass filters, low pass filters, high pass filters, notch filters, and/or other optical filters) to filter electromagnetic radiation before the radiation reaches the image capture component 130. In certain other embodiments, alternatively or in addition to filters located in front of the electromagnetic radiation, processing component 110 may be configured to filter images captured by the image capture component 130 with, for example, software within processing component 110. In certain other embodiments, the optical filters (e.g., warm filters, bandpass filters, low pass filters, high pass filters, notch filters, and/or other optical filters) may be integrated within the image capture component 130. For embodiments where the image capture component 130 is an array, the optical filters may be integrated within each sensor of the array and/or integrated as one or more optical filters covering a plurality of sensors.

The logic device 170 and/or the processing component 110 (via the interface 190) may be adapted to receive image signals from the image capture component 130, process image signals (e.g., to provide processed image data), store image signals or image data in the local memory 180 and/or the memory component 120, and/or retrieve stored image signals from the respective memories. Image data, either high dynamic range image data or low dynamic range image data, may be transferred between the first camera 102 and the control device 104 via the interface 190. In certain embodiments, the image data transferred may be compressed image data. Processing component 110 may be adapted to process image signals received to provide image data (e.g., reconstructed image data) to the display component 140 for viewing by a user.

Display component 140 includes, in one embodiment, an image display device (e.g., a liquid crystal display (LCD)) or various other types of generally known video displays or monitors. Processing component 110 may be adapted to display image data and information on display component 140 that the processing component 110 retrieved from the memory component 120, processed from image data received via the interface 190, or processed from any other source. Display component 140 may include display electronics, which may be utilized by processing component 110 to display image data and information. Display component 140 may receive image data and information directly from image capture component 130 via the interface 190, from the logic device 170 via the interface 190, or the image data and information may be transferred from memory component 120.

In various aspects, display component 140 may be remotely positioned (e.g., housed in a separate housing) from the image capture component 130, and processing component 110 may be adapted to remotely display image data and information on display component 140 via wired or wireless communication with display component 140, as described herein.

Control component 150 includes, in one embodiment, a user input and/or interface device having one or more user actuated components, such as one or more push buttons, slide bars, rotatable knobs or a keyboard, that are adapted to generate one or more user actuated input control signals. Control component 150 may be adapted to be integrated as part of display component 140 to operate as both a user input device and a display device, such as, for example, a touch screen device adapted to receive input signals from a user touching different parts of the display screen. Processing component 110 may be adapted to sense control input signals from control component 150 and respond to any sensed control input signals received therefrom.

Control component 150 may include, in one embodiment, a control panel unit (e.g., a wired or wireless handheld control unit) having one or more user-activated mechanisms (e.g., buttons, knobs, sliders, or others) adapted to interface with a user and receive user input control signals. In various embodiments, it should be appreciated that the control panel unit may be adapted to include one or more other user-activated mechanisms to provide various other control operations of imaging system 100, such as auto-focus, menu enable and selection, field of view (FoV), brightness, contrast, gain, offset, spatial, temporal, and/or various other features and/or parameters. In other embodiments, a variable gain signal may be adjusted by the user or operator based on a selected mode of operation.

In another embodiment, control component 150 may include a graphical user interface (GUI), which may be integrated as part of display component 140 (e.g., a user actuated touch screen), having one or more images of the user-activated mechanisms (e.g., buttons, knobs, sliders, or others), which are adapted to interface with a user and receive user input control signals via the display component 140. As an example for one or more embodiments as discussed further herein, display component 140 and control component 150 may represent appropriate portions of a smart phone, a tablet, a personal digital assistant (e.g., a wireless, mobile device), a laptop computer, a desktop computer, or other type of device.

In certain embodiments, the first camera 102 may include the control component 150 and/or the display component 140 instead of or in addition to the control device 104. It is appreciated that the various components described herein may be included on either or both of the first camera 102 and the control device 104.

Sensing component 160 includes, in one embodiment, one or more sensors to detect environmental conditions and/or operating conditions of the imaging system 100. For example, the sensing component 160 may include one or more environmental sensors that may detect temperature, humidity, air pressure, lighting conditions, and/or other conditions of the environment around one or more components of the imaging system 100. Alternatively or additionally, the sensing component 160 may include sensors that may, for example, detect moisture and/or the formation of ice on components of the imaging system 100 or components coupled to the imaging system 100.

Processing component 110 and/or logic device 170 may be adapted to communicate with sensing component 160 (e.g., by receiving sensor information from sensing component 160) and image capture component 130 (e.g., by receiving data and information from image capture component 130 and providing and/or receiving command, control, and/or other information to or from other components of imaging system 100). In certain embodiments, a component may communicate with another component via the interface 190.

In various embodiments, sensing component 160 may be adapted to provide data and information relating to system applications including a handheld implementation and/or coupling implementation associated with various types of vehicles (e.g., a land-based vehicle, a watercraft, an aircraft, a spacecraft, or other vehicle) or stationary applications (e.g., a fixed location, such as on a structure). In one embodiment, sensing component 160 may include communication devices that relay information to processing component 110 via wireless communication. For example, sensing component 160 may be adapted to receive and/or provide information through a satellite, through a local broadcast transmission (e.g., radio frequency), through a mobile or cellular network and/or through information beacons in an infrastructure (e.g., a transportation or highway information beacon infrastructure) or various other wired or wireless techniques (e.g., using various local area or wide area wireless standards).

In another embodiment, imaging system 100 may include one or more other types of sensing components 160, including environmental and/or operational sensors, depending on the sensed application or implementation, which provide information to processing component 110 (e.g., by receiving sensor information from each sensing component 160). In various embodiments, other sensing components 160 may be adapted to provide data and information related to environmental conditions, such as internal and/or external temperature conditions, lighting conditions (e.g., day, night, dusk, and/or dawn), humidity levels, specific weather conditions (e.g., sun, rain, and/or snow), distance (e.g., laser rangefinder), and/or whether a tunnel, a covered parking garage, or that some type of enclosure has been entered or exited. Accordingly, other sensing components 160 may include one or more conventional sensors as would be known by those skilled in the art for monitoring various conditions (e.g., environmental conditions) that may have an effect (e.g., on the image appearance) on the data provided by image capture component 130. The other sensing components 160 may be located on the first camera 102, as shown in FIG. 1, on the control device 104, on both the first camera 102 and the control device 104, or, alternatively or additionally, on another device separate from the first camera 102 and the control device 104.

In some embodiments, other sensing components 160 may include devices that relay information to processing component 110 via wireless communication. For example, each sensing component 160 may be adapted to receive information from a satellite, through a local broadcast (e.g., radio frequency) transmission, through a mobile or cellular network and/or through information beacons in an infrastructure (e.g., a transportation or highway information beacon infrastructure) or various other wired or wireless techniques.

The heating element 162 may be, for example, an electronic heater configured to heat the lens barrel 106, the image capture component 130, and/or another portion of the first camera 102 and/or the control device 104. In certain embodiments, the heating element 162 may heat at least a portion of lens barrel 106, such as the front of lens barrel 106. The heating element 162 may be attached to the lens barrel 106 and/or may be positioned so that heat generated by the heating element 162 may be conducted to the lens barrel 106. The lens barrel 106 may include one or more of the optical components 132 and heat generated by heating element 162 can be conducted to increase the temperature of optical components 132.

In various embodiments, components of imaging system 100 may be combined and/or implemented or not, as desired or depending on application requirements, with imaging system 100 representing various operational blocks of a system. For example, processing component 110 may be combined with memory component 120, image capture component 130, display component 140, and/or sensing component 160. In another example, processing component 110 may be combined with image capture component 130 with only certain operations of processing component 110 performed by circuitry (e.g., a processor, a microprocessor, a microcontroller, a logic device, or other circuitry) within image capture component 130. In still another example, control component 150 may be combined with one or more other components or be remotely connected to at least one other component, such as processing component 110, via a wired or wireless control device so as to provide control signals thereto.

In one embodiment, second communication component 152 and/or first communication component 172 may be implemented as a network interface component (NIC) adapted for communication with a network including other devices in the network. In various embodiments, second communication component 152 and/or first communication component 172 may include a wireless communication component, such as a wireless local area network (WLAN) component based on the IEEE 802.11 standards, a wireless broadband component, mobile cellular component, a wireless satellite component, or various other types of wireless communication components including radio frequency (RF), microwave frequency (MWF), and/or infrared frequency (IRF) components adapted for communication with a network. As such, second communication component 152 and/or first communication component 172 may include an antenna coupled thereto for wireless communication purposes. In other embodiments, the second communication component 152 and/or first communication component 172 may be adapted to interface with a DSL (e.g., Digital Subscriber Line) modem, a PSTN (Public Switched Telephone Network) modem, an Ethernet device, and/or various other types of wired and/or wireless network communication devices adapted for communication with a network. The first communication component 172 may send radiometric thermal images or video over the interface 190 to the second communication component 152.

Figure 2:
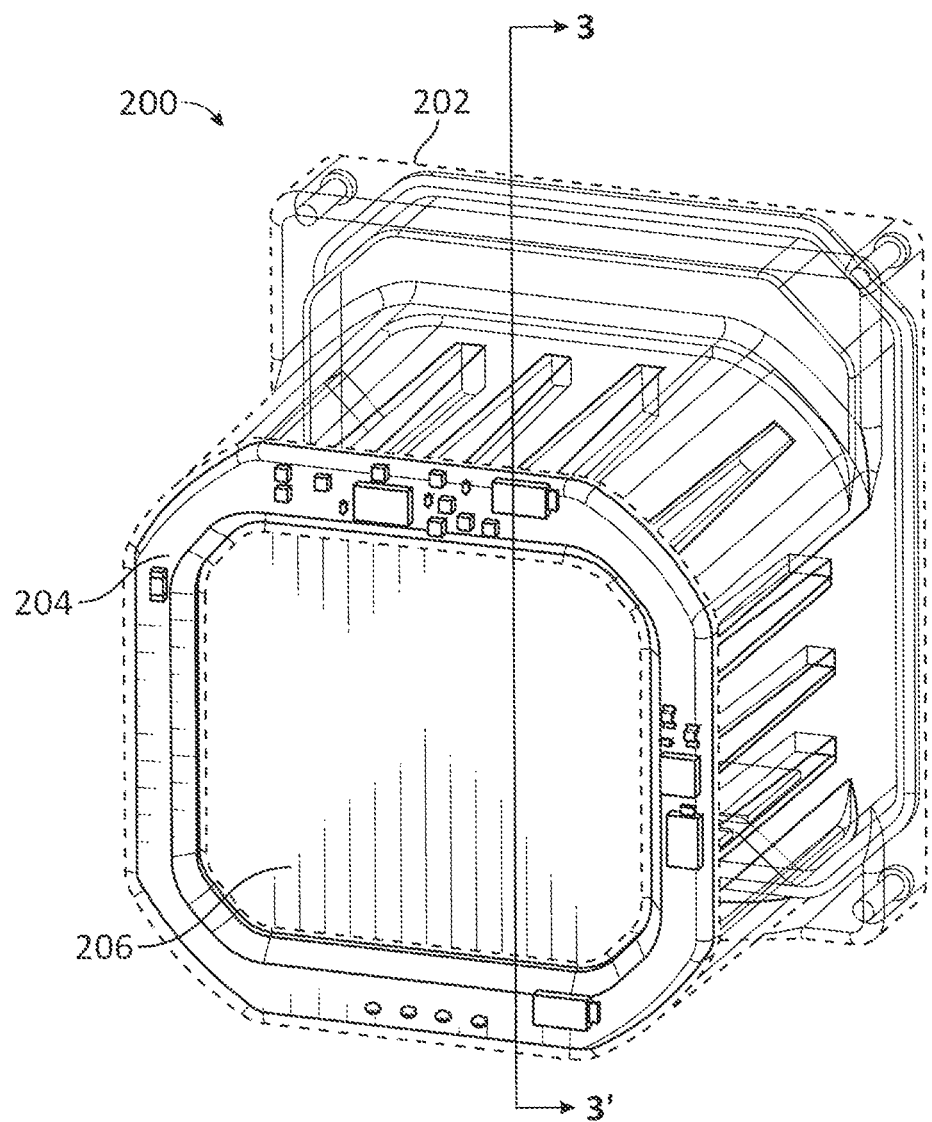
FIG. 2 illustrates a camera in accordance with an embodiment of the disclosure.

FIG. 2 illustrates a camera in accordance with an embodiment of the disclosure. FIG. 2 illustrates a camera 200 that includes a housing 202, a heating element 204, and an optical component 206. The optical component 206 may be similar to optical component 132 described in FIG. 1 and may include one or more lenses. The one or more lenses may be any appropriate lens material such as glass, germanium, quartz glass, fluorite, plastic, meteoritic glass, and/or Chalcogenide.

The housing 202 may be a molded or machined housing configured to enclose one or more other components of camera 200 (e.g., optical components, image capture components, processors, and/or other components as described herein). For example, the housing 202 may enclose an outer perimeter of the optical component 206. As such, the optical component 206 may be set within the housing 202. In certain embodiments, the optical components 206 may be set within a lens barrel of the housing 202. The lens barrel may, for example, house the optical component 206 as well as allow for adjustment of positioning of the optical component 206 within the housing 202 by, for example, telescoping the lens barrel and/or moving the position of the optical component 206.

Heating element 204 may be positioned proximate the optical component 206 and the front of the housing 202. Such a position for the heating element 204 can result in effective heating of both optical component 206 and the front of housing 202. Heating both the optical component 206 and the front of housing 202 can allow for melting of all ice accumulated on the front of camera 200. Such a configuration can allow for accumulated ice to be quickly melted without the formation of air pockets within the ice.

In certain embodiments, heating element 204 may be a printed circuit board (PCB) or a portion thereof and/or may include one or more heater traces or resistive heater components. That is, heating element 204 may be coupled to a PCB and/or the PCB may at least partially operate heating element 204. In certain embodiments, some or all of the components required to control operation of heating element 204 (e.g., controlling heater traces) may be disposed on the PCB. Such a configuration may reduce the number of components (e.g., cables, connectors, or other control boards) needed to control operation of heating element 204.

Other components, such as image processing components, may also be disposed on the PCB. In other embodiments, heating element 204 may be other heating elements such as flexible heating elements or circuits, traces, and/or resistive heating elements.

Figure 3:
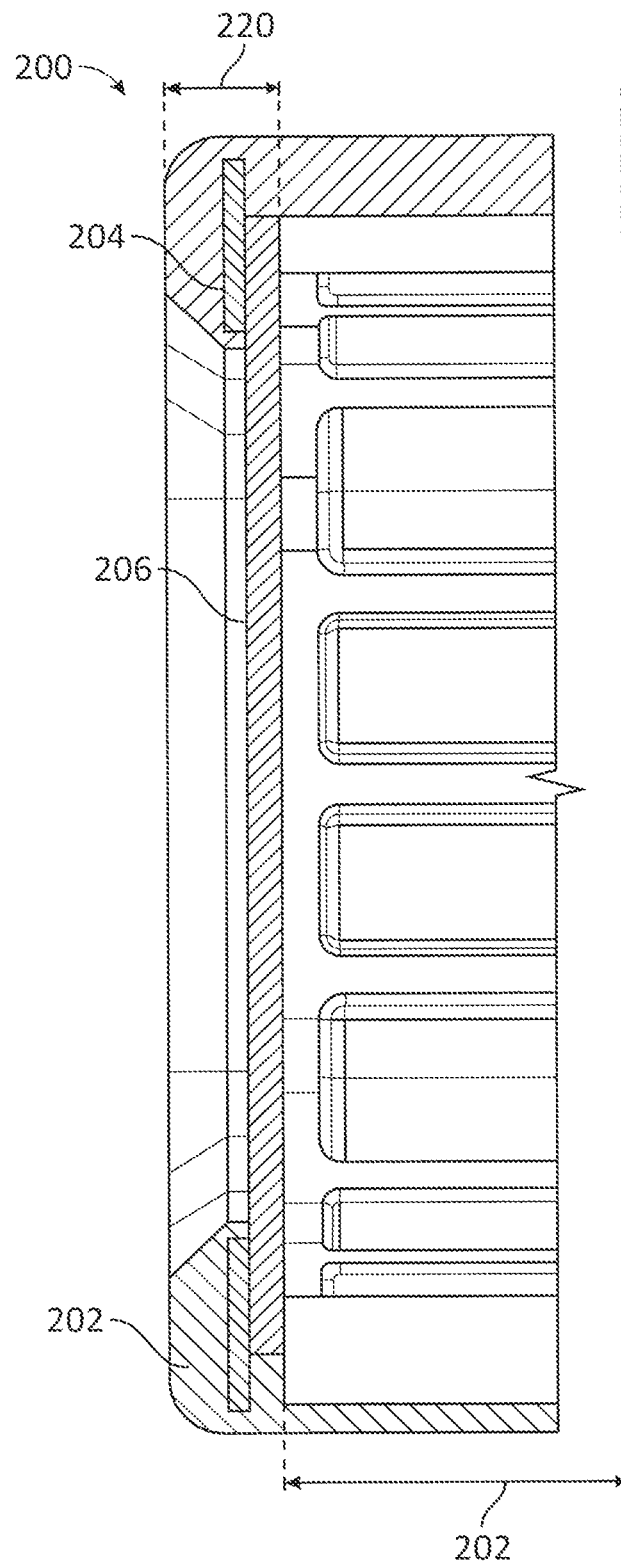
FIG. 3 illustrates a side cutaway view of the camera of FIG. 2 in accordance with an embodiment of the disclosure.

The positioning of heat element 204 can be further detailed in FIG. 3. FIG. 3 illustrates a side cutaway view of the camera of FIG. 2 in accordance with an embodiment of the disclosure. FIG. 3 illustrates a side cutaway view of camera 200 along plane 33' shown in FIG. 2.

As shown in FIG. 3, the front of housing 202 may include a lip extending away from optical component 206. Due to the lip, heating of just the optical component 206 may be more likely to result in the formation of an air pocket. The configuration shown in FIG. 3 allows for heating element 204 to be disposed within the lip extending away from the optical component 206 in, for example, region 220 (the "front region"). Region 220 may dispose heating element 204 in front of or proximate to optical component 206 and behind the frontal edge of housing 202. Such a position may minimize both the distance from heating element 204 to optical component 206 and from heating element 204 to the front of housing 202. As such, the rate of heat transfer from heating element 204 to optical component 206 and the front of housing 202 may be increased.

In certain embodiments, at least a portion of heating element 204 may contact and/or adhere to (e.g., glued or taped) optical component 206 to further improve the rate of heat transfer to optical component 206. In certain embodiments, heating element 204 may be coupled to optical component 206 through a thermally conductive adhesive.

Positioning of heating element 202 in region 220 close to optical component 206 and the front of housing 202 (e.g., between optical component 206 and the front of housing 202) may further allow for heating element 202 to be positioned farther from any image capture component. Image capture components may be disposed within region 222 (the "second region") rearward of region 220. In infrared imaging applications, heat generated by heating elements may impact the quality of the image obtained. As infrared sensors (e.g., bolometers) are typically disposed behind optical component 206 (e.g., within region 220), disposing heating element 204 towards the front of housing and, thus, away from the infrared sensors may increase the quality of the images obtained. Such a configuration may minimize the effect of heat from the heating element 204 on the images obtained by the infrared sensors.

Housing 202 may be made from a variety of materials. In certain embodiments, housing 202 may be a material with a low value of thermal conductivity, such as plastic. The low thermal conductivity of such materials for housing 202 may reduce heat transfer between other portions of housing 202, concentrating heat within the front of housing 202 and optical component 206.

In certain embodiments, housing 202 may be made from a plurality of materials. That is, the portion of the housing 202 that heating element 204 is disposed within, such as region 220, may be a first material with high thermal conductivity. Meanwhile, other portions of the housing 202, such as region 222, may be made from other materials with a lower thermal conductivity. Such a configuration may concentrate heat produced by the heating element 204 within region 220, to aid in melting of ice. Such a multi-material housing 220 may be produced through the techniques described herein, such as through the molding techniques described in FIG. 7. In certain embodiments, region 220 may be a bezel disposed on the front of housing 202.

Figure 4A:
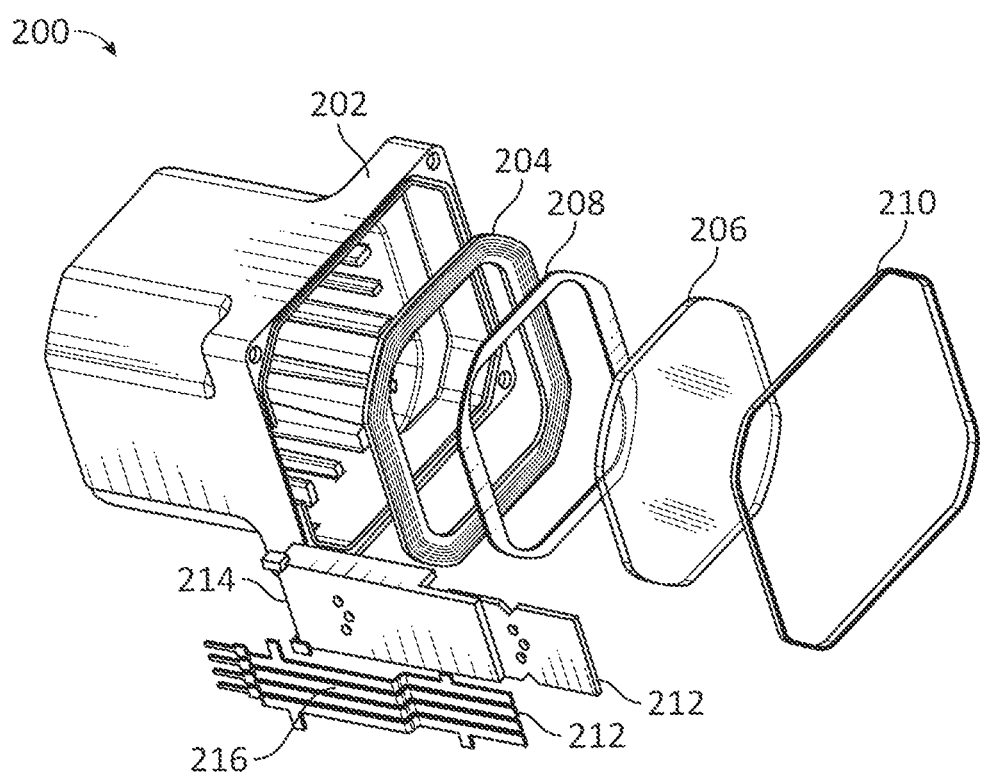
FIG. 4A illustrates an exploded view of a camera in accordance with an embodiment of the disclosure.
Figure 4B:
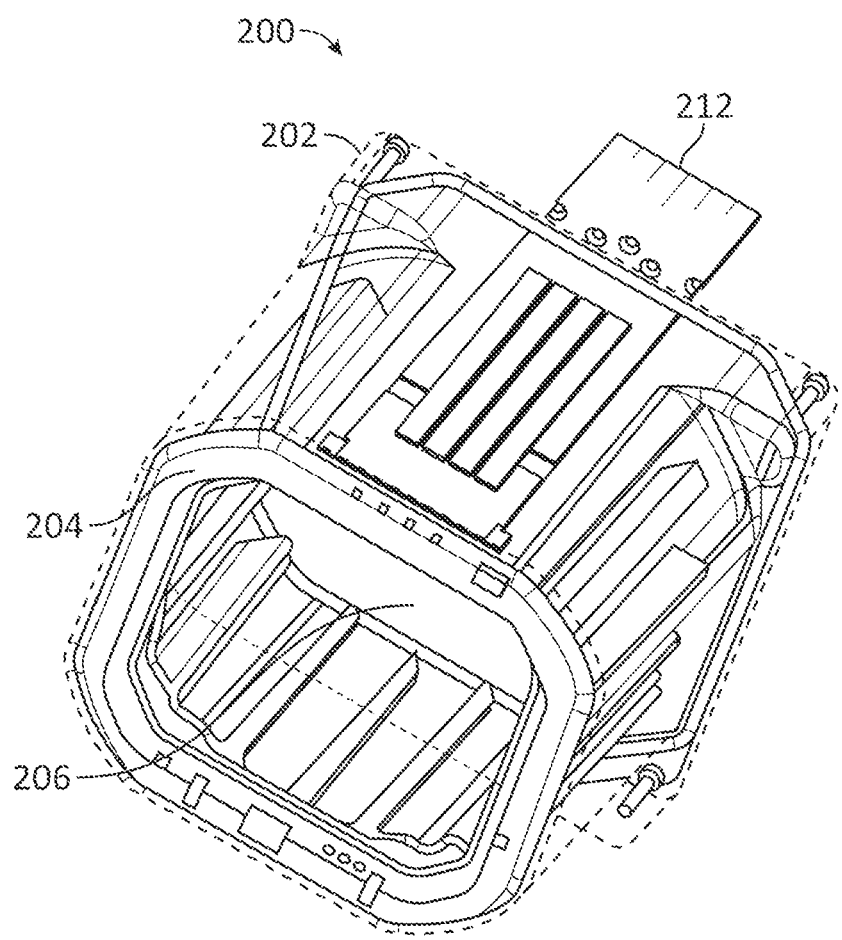
FIGS. 4B and 4C illustrate front and rear view of a camera in accordance with embodiments of the disclosure.
Figure 4C:
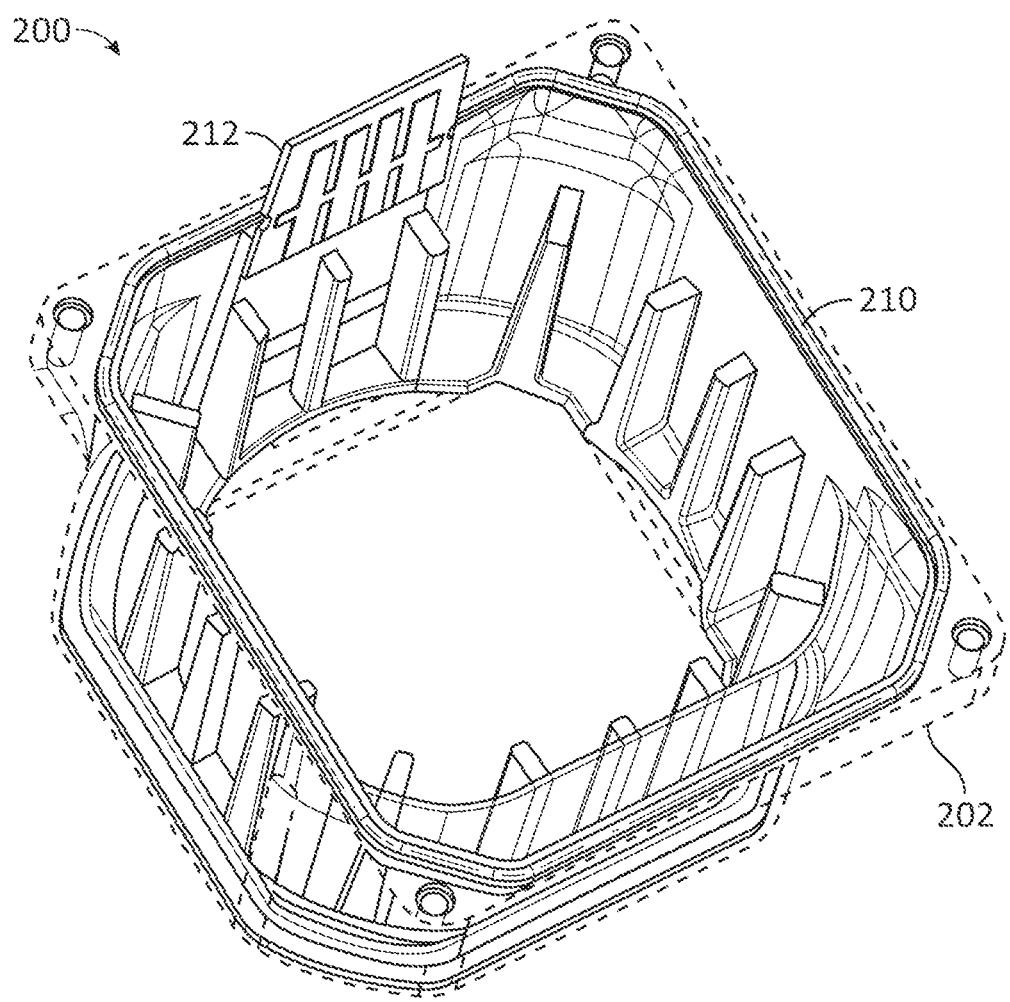

FIG. 4A illustrates an exploded view of a camera in accordance with an embodiment of the disclosure. FIGS. 4B and 4C illustrate front and rear view of a camera in accordance with embodiments of the disclosure. FIGS. 4A-C may illustrate various components of camera 200, such as housing 202, heating element 204, optical component 206, adhesive 208, gasket 210, and power connector 212.

Housing 202, heating element 204, and optical component 206 may be similar to components described herein. Adhesive 208 may couple (e.g., adhere) heating element 204 to optical component 206. Adhesive 208 may more securely attach optical component 206 to housing 202.

Gasket 210 may be coupled to or be a portion of housing 202. In certain embodiments, camera 200 may be coupled to another component or may include other components that are coupled to an end of housing 202. Such a component may be coupled to the end of housing 202. Gasket 210 may be at least partially disposed between housing 202 and the component to maintain an environmental seal against moisture and debris. Gasket 210 may be compressed to seal at least a portion of the area where housing 202 couples to the component. Thus, gasket 210 may be made of a compressible material. In certain embodiments, such a material may be softer than the material of housing 202.

Power connector 212 may include holder 214 and contacts 216. Contacts 216 may be disposed within holder 214. Power connector 212 may be a blind mate connector that includes aligning features. Such aligning features may result in improved contact between contacts 216 and contacts of the component that housing 202 is mating with. In certain embodiments, contacts 216 may be spring contacts to further improve mating.

Figure 5A:
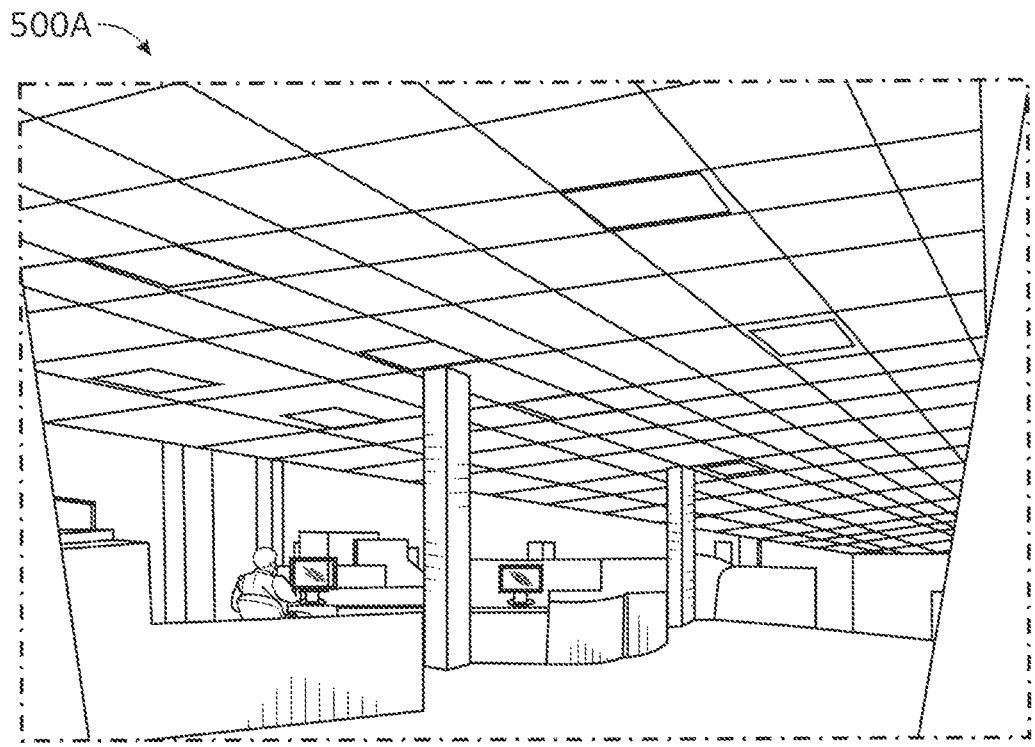
FIGS. 5A and 5B illustrate images obtained from various cameras according to embodiments of the disclosure.
Figure 5B:
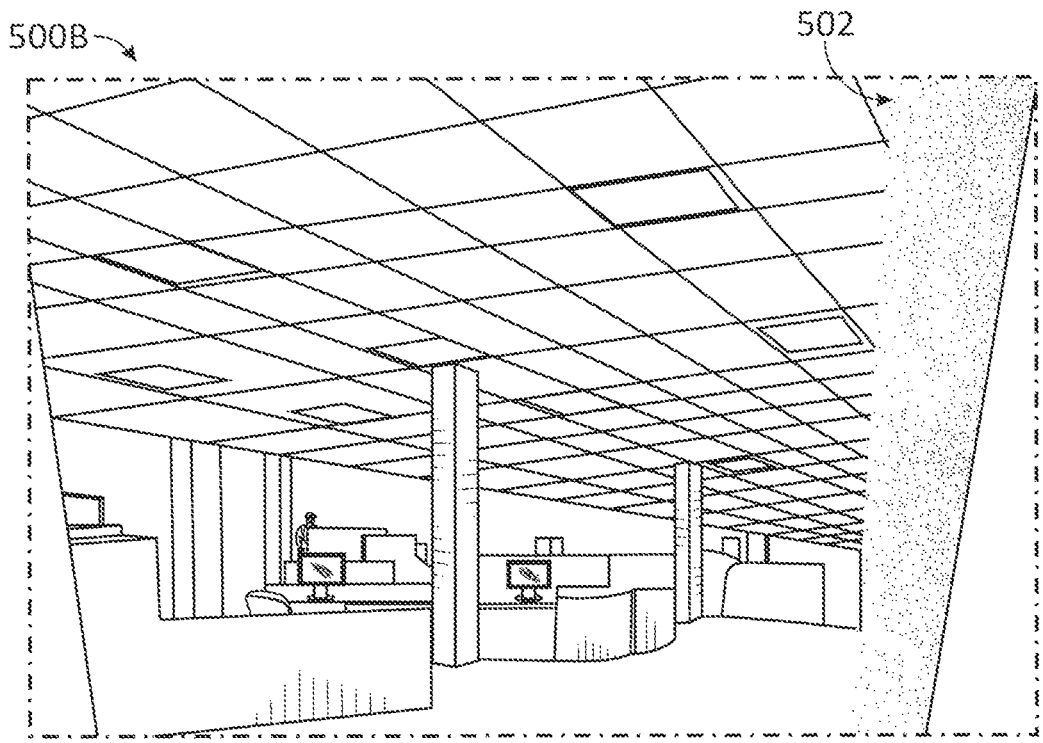

FIGS. 5A and 5B illustrate images obtained from various cameras according to embodiments of the disclosure. Image 500A of FIG. 5A is an image captured by a camera with a heating element configuration as described herein (e.g., in FIGS. 2, 3, and 4A-C). As heating element is located proximate the lens and the front of the housing, minimal heat is transferred to the interior of the housing. As such, image 500A is a clear image free of artifacts.

By contrast, image 500B of FIG. 5B is an image captured by a camera with a conventional heater. Such a heater can transfer significant heat to other portions of the housing, resulting in image artifact 502 within image 500B.

Figure 6:
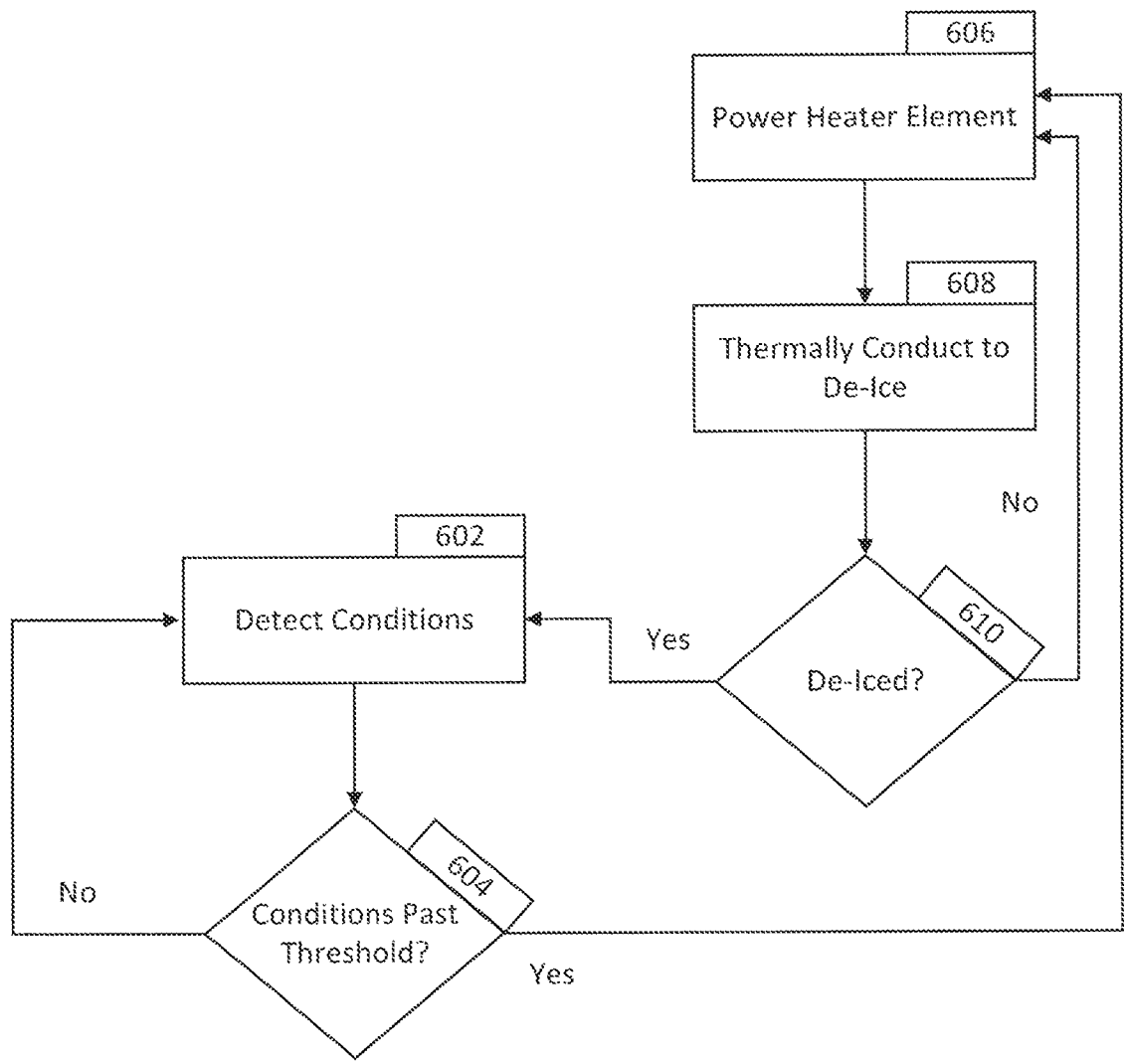
FIG. 6 illustrates a flowchart of a process of operating a camera in accordance with an embodiment of the disclosure.

FIG. 6 illustrates a flowchart of a process of operating a camera in accordance with an embodiment of the disclosure. The process described in FIG. 6 may be performed with an imaging system described herein that may include camera 200. For the purposes of this disclosure, the technique of FIG. 6 is described with the elements of imaging system 100, but other embodiments may utilize other imaging systems.

In block 602, the sensing component 160 may detect conditions of the imaging system 100 and/or the environment around the imaging system 100. For example, the sensing component 160 may detect formation of ice on the optical component 132 of the camera 102 and/or lens barrel 106, may detect environment conditions such as ambient temperature, humidity, air pressure, wind speed, ambient lighting conditions, and other such conditions, and/or may detect a surface temperature of a component of the imaging system 100 such as the optical component 132, the lens barrel 106, and/or another portion of the housing, the optical component 132, and/or another component of the imaging system 100. The sensing component 160 may output data associated with such conditions to the logic device 170 and/or the processing component 110. Certain embodiments may be configured to sense multiple different conditions (e.g., ambient temperature and temperature of the optical component 132).

In block 604, the conditions detected may be compared to one or more thresholds to determine whether the thresholds have been surpassed. For example, if the sensing component 160 is configured to detect an ambient and/or surface temperature, the temperature detected may be compared to determine whether the temperature detected is below a threshold temperature (e.g., a threshold temperature of between 32-40 degrees F.). In certain embodiments, the threshold may be changed depending on other detected ambient conditions such as air pressure, wind speed, and/or lighting conditions. Additionally, if the sensing component 160 is configured to detect ice build-up, the threshold may be the detection of ice and/or the detection of a threshold amount of ice.

If the threshold has not been detected to be surpassed, the process may revert back to block 602 and continue to detect conditions. If the threshold has been detected to be surpassed, the process may continue to block 606. In block 606, power may be provided to the heating element 162. The heating element 162 may then generate heat.

In block 608, the heat generated by the heating element 162 may be conducted to the optical component 132 and/or lens barrel 106 (e.g., the front of the lens barrel 106). In certain embodiments, heat generated by the heating element 162 may be conducted to the lens barrel 106 or a portion thereof and then conducted to the optical component 132.

In optional block 610, de-icing of the optical component 132 and a portion of the lens barrel 106 may be confirmed by, for example, certain sensors of the sensing component 160. In certain such embodiments, if the optical component 132 and the portion of the lens barrel 106 are detected to be free of ice, the imaging system 100 may return to detecting conditions in block 602. Other embodiments may power the heating element 162 for a set period of time. In certain embodiments, the heating element 162 may be powered off upon confirmation that the de-icing process has been completed. If de-icing has not been confirmed, the process may return to block 606.

In certain embodiments, if the conditions for powering the heating element 162 have been detected, the heating element 162 may continue to be powered until, for example, the imaging system 100 has been powered off. In other embodiments, there may be manual controls for a user to power the heating element 162 and thus de-ice the optical component 132. In additional embodiments, the heating element 162 may be continuously powered on.

Figure 7:
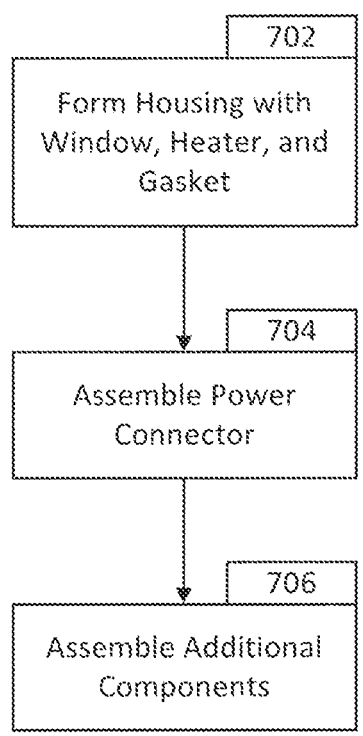
FIG. 7 illustrates a flowchart of a process of manufacturing a camera in accordance with an embodiment of the disclosure.

FIG. 7 illustrates a flowchart of a process of manufacturing a camera in accordance with an embodiment of the disclosure. Traditionally, a camera includes at least a housing, often made of two parts. The two parts compress one or more seals at a junction point to maintain an environmental seal against moisture and debris. If the camera includes a window or lens, such a window or lens typically needs to be disposed within the housing. The window or lens is then held in place with adhesive or with a mechanical retention system. Additionally, if the camera includes a heater, the heater would need to be controlled and powered, which usually necessitates a cable, connector and controlling circuit board, all of which must be assembled to the camera in separate manufacturing steps. Such traditional cameras require a multitude of steps to manufacture, resulting in higher cost, lower throughput, and higher input requirements.

FIG. 7 illustrates a technique of manufacturing a camera or a windowed environmental enclosure thereof (e.g., at least a portion of camera 200 as shown in FIG. 4A). In step 702, the housing 202, optical components 206, heating element 204, and gasket 210 may be molded around the heating element 204. As the housing 202, heating element 204, optical components 206, and/or the gasket 210 may be different materials, each individual component may be molded in separate operations within the mold, though a single tool may be used for all operations and, thus, the components would not need to be transferred between tools or molds. In certain embodiments, the heating element 204 may be an initial component placed within the tool. In other embodiments, the heating element 204 may also be molded (e.g. with low pressure molding as described herein).

In certain embodiments, different molding techniques may be used for different components. For example, the housing 202, the window 206, and the heating element 204 may be insert molded using low pressure molding technology. Low pressure molding may ensure that the electronics (e.g., of heating element 204) and the window 206 are not damaged during the manufacturing process.

Gasket 210 may be over-molded on an end of housing 202. Over-molding of gasket 210 may create a reliable seal. Since the gasket 210 is molded to the housing 202, the side where the gasket 210 is molded to the housing 202 has a very low risk of leaks. As over-molding of the gasket 210 allows for the gasket 210 to fill all gaps, the surface finish on that end of the housing 202 is no longer critical, allowing for a less expensive molding process for the housing 202. Furthermore, as the gasket 210 is molded to the housing 202 instead of placed there, the risk of improper location of the gasket is eliminated.

In block 704, the power connector 212 may be assembled to the camera 200. In certain embodiments, holder 214 may be molded to the housing 202 in a separate step or in the step of block 702. In other embodiments, holder 214 may be a separately molded part. Contacts 216 may be fabricated by stamping, progress die sheet metal processing, or other techniques. Contacts 216 may be coupled to holder 214 (e.g., inserted, press fit, or soldered to holder 214).

In block 706, additional components of camera 200 or an imaging system that includes camera 200 can be assembled. For example, sensors such as bolometers, power supplies, connectors, and/or other components may be coupled to camera 200. Thus, a complete imaging system may be completed after block 706.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. An apparatus comprising:
a housing comprising a front region;
an optical element disposed proximate to the front region; and
a heating element thermally conductively coupled to the front region, wherein the heating element is disposed proximate to the optical element and the front region, wherein the front region is disposed forward of the optical element, wherein the front region defines a lip of the housing disposed forward of the optical element, wherein the heating element comprises a plurality of surfaces, wherein at least a portion of the heating element adheres to and/or directly contacts the optical element such that the heating element is disposed along a perimeter of the optical element and a center region of the optical element is not obscured by the heating element, and wherein the heating element is configured to conductively heat the optical element and the front region,
wherein the heating element is disposed within the lip of the front region such that:
a first portion of a first surface of the heating element adheres to and/or directly contacts the optical element; and
remaining surfaces of the heating element contact the housing; and
wherein a second portion of the first surface of the heating element contacts the housing.

2. The apparatus of claim 1, wherein the heating element is disposed forward of the optical element.

3. The apparatus of claim 1, further comprising a controller configured to perform operations comprising:
detect a temperature of the optical element and/or an environment around the optical element;
determine whether the temperature is below a threshold temperature; and
provide, responsive to determining that the temperature is below a threshold temperature, instructions to power the heating element.

4. The apparatus of claim 3, further comprising an environmental temperature sensor configured to detect the temperature of the environment and provide temperature data to the controller, wherein the controller is configured to, at least in part, detect the temperature of the environment from the temperature data.

5. The apparatus of claim 3, further comprising an optical element sensor configured to detect the temperature of the optical element and provide temperature data to the controller, wherein the controller is configured to, at least in part, detect the temperature of the optical element from the temperature data.

6. The apparatus of claim 1, wherein the heating element comprises a resistive heating element.

7. The apparatus of claim 1, wherein the optical element comprises a first material and the housing comprises a second material different from the first material, wherein the housing further comprises a second region rearward of the front region, and wherein the front region comprises the second material and the second region comprises a third material different from the second material.

8. The apparatus of claim 7, wherein the third material has a lower thermal conductivity than the second material.

9. The apparatus of claim 1, further comprising an imager configured to receive image data of at least a scene and output image data associated with the scene, wherein the imager is configured to receive image data in an infrared wavelength, wherein the imager is disposed rearward of the heating element, wherein the optical element comprises a first surface and a second surface opposite the first surface, wherein the portion of the heating element adheres to and/or directly contacts the first surface of the optical element, and wherein the optical element is configured to transmit infrared radiation from the second surface toward the imager.

10. The apparatus of claim 9, wherein the imager is configured to receive image data in a thermal infrared wavelength.

11. The apparatus of claim 1, further comprising a gasket disposed on a rearward portion of the housing.

12. A method of manufacturing the apparatus of claim 11, the method comprising:
low-pressure molding the housing and the optical element to the heating element in a continuous molding process;
over-molding the gasket to the housing in the continuous molding process; and
coupling a power connector to the housing.

13. The method of claim 12, wherein the power connector comprises a holder and contacts.

14. The method of claim 13, wherein the holder is molded to the housing in the continuous molding process.

15. The method of claim 13, wherein the contacts are inserted into the holder.

16. The apparatus of claim 1, further comprising an adhesive disposed between the heating element and the perimeter of the optical element to adhere the portion of the heating element to the perimeter of the optical element.

17. An apparatus comprising:
a housing comprising a front region;
an optical element disposed proximate to the front region;
a heating element thermally conductively coupled to the front region, wherein the heating element is disposed proximate to the optical element and the front region, wherein at least a portion of the heating element adheres to and/or directly contacts the optical element such that the heating element is disposed along a perimeter of the optical element and a center region of the optical element is not obscured by the heating element, and wherein the heating element is configured to conductively heat the optical element and the front region;
a controller configured to perform operations comprising:
detect formation of ice on the optical element; and
provide, responsive to detecting formation of ice, instructions to power the heating element; and
an ice detection sensor configured to detect formation of ice on the optical element and provide, responsive to detecting formation of ice, data to the controller indicating formation of ice on the optical element, wherein the controller is configured to, at least in part, detect formation of the ice from the data.

18. The apparatus of claim 17, further comprising an imager configured to receive image data of at least a scene and output image data associated with the scene, wherein the imager is configured to receive image data in an infrared wavelength, wherein the imager is disposed rearward of the heating element, wherein the optical element comprises a first surface and a second surface opposite the first surface, wherein the portion of the heating element adheres to and/or directly contacts the first surface of the optical element, and wherein the optical element is configured to transmit infrared radiation from the second surface toward the imager.

19. The apparatus of claim 17, wherein the front region defines a lip of the housing disposed forward of the optical element, and wherein the heating element is disposed within the lip of the front region.

20. An apparatus comprising:
a housing comprising a front region;
an optical element disposed proximate to the front region; and
a heating element thermally conductively coupled to the front region, wherein the heating element is disposed proximate to the optical element and the front region, wherein the front region is disposed forward of the optical element, wherein the front region defines a lip of the housing disposed forward of the optical element, wherein the heating element comprises a plurality of surfaces, wherein at least a portion of the heating element adheres to and/or directly contacts the optical element such that the heating element is disposed along a perimeter of the optical element and a center region of the optical element is not obscured by the heating element, and wherein the heating element is configured to conductively heat the optical element and the front region, wherein the heating element is disposed within the lip of the front region such that:
a first portion of a first surface of the heating element adheres to and/or directly contacts the optical element; and
remaining surfaces of the heating element contact the housing; and
wherein each surface of the plurality of surfaces of the heating element is a planar surface.

* * * * *